United States Patent
Lin

(10) Patent No.: US 11,611,318 B1
(45) Date of Patent: Mar. 21, 2023

(54) DYNAMIC AMPLIFIER OF LARGE OUTPUT SWING

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 14 days.

(21) Appl. No.: 17/528,243

(22) Filed: Nov. 17, 2021

(51) Int. Cl.
*H03F 3/16* (2006.01)
*H03F 3/04* (2006.01)

(52) U.S. Cl.
CPC ..................... *H03F 3/16* (2013.01)

(58) Field of Classification Search
CPC ..................... H03F 3/16; H03F 3/04
USPC .................................. 330/277, 288
See application file for complete search history.

(56) References Cited

U.S. PATENT DOCUMENTS

| | | | | |
|---|---|---|---|---|
| 4,835,489 A | * | 5/1989 | Monticelli | H03F 1/083 330/288 |
| 6,728,494 B2 | * | 4/2004 | Numata | H04B 10/50 330/288 |

* cited by examiner

*Primary Examiner* — Hieu P Nguyen
(74) *Attorney, Agent, or Firm* — McClure, Qualey & Rodack, LLP

(57) ABSTRACT

A dynamic amplifier includes a common-source amplifier configured to receive a gate voltage at a gate node and output a drain current to a drain node; a current mirror configured to mirror the drain current into an output current to an output current; a source capacitor connected to the source node; a load capacitor connected to the output node; a first switch configured to conditionally connect the gate node to an input voltage; a second switch configured to conditionally connect the gate node to a gate-resetting voltage; a third switch configured to conditionally connect the source node to a source-resetting voltage; a fourth switch configured to conditionally connect the drain node to a drain-resetting voltage; and a fifth switch configured to conditionally connect the output node to an output-resetting voltage.

10 Claims, 2 Drawing Sheets

DYNAMIC AMPLIFIER OF LARGE OUTPUT SWING

BACKGROUND OF THE DISCLOSURE

Field of the Disclosure

This present disclosure generally relates to dynamic amplifiers and particularly relates to dynamic amplifiers having a large output swing.

Description of Related Art

A dynamic amplifier amplifies an input voltage signal into an output voltage signal in accordance with a logical signal, without using a static bias current. A schematic diagram of a prior art dynamic amplifier 100 is shown in FIG. 1. Dynamic amplifier 100 comprises: a NMOS transistor MN0 configured to receive a gate voltage $V_a$ at a gate node 101 and output an output voltage $V_{out}$ at a drain node 102 in accordance with a source voltage $V_b$ at a source node 103; a source capacitor $C_{src}$ connected to the source node 103; a drain capacitor $C_{drn}$ connected to the drain node 102; a first switch 131 configured to conditionally connect the gate node 101 to an input voltage $V_{in}$ in accordance with a first logical signal CK1; a second switch 132 configured to conditionally connect the gate node 101 to ground in accordance with a second logical signal CK2; a third switch 133 configured to conditionally connect the source node 103 to ground in accordance with a third logical signal CK3; and a fourth switch 134 configured to conditionally connect the drain node 102 to a power supply node $V_{DD}$ in accordance with a fourth logical signal CK4. Dynamic amplifier 100 works in a two-phase manner including a reset phase and an amplification phase. During the reset phase: CK1 is de-asserted, while CK2, CK3, and CK4 are asserted, and consequently switch 131 is turned off and switches 132, 133, and 134 are turned on; and as a result, $V_a$ and $V_b$ are pulled down to ground and $V_{out}$ is pulled up to $V_{DD}$. During the amplification phase: CK1 is asserted, while CK2, CK3, and CK4 are de-asserted, and consequently switch 131 is turned on and switches 132, 133, and 134 are turned off; and as a result, $V_a$ is approximately equal to $V_{in}$, NMOS transistor MN0 injects a first current $I_1$ to the source node 103 and draws a second current $I_2$ from the drain node 102, causing $V_b$ to rise and $V_{out}$ to fall until a gate-to-source voltage of NMOS transistor MN0 reaches its threshold voltage, say $V_{th0}$. In the amplification phase, an increase of the charge of the source capacitor $C_{src}$ is approximately equal to a decrease of the charge of the drain capacitor $C_{drn}$ and is determined by a difference between the input voltage signal $V_{in}$ and the threshold voltage $V_{th0}$ of NMOS transistor MN0. At the end of the amplification phase, a source-to-drain voltage of NMOS transistor MN0 reaches its threshold voltage $V_{th0}$, and can be expressed as:

$$V_b = V_{in} - V_{th0} \quad (1)$$

$$V_{out} = V_{DD} - V_b \cdot \frac{C_{src}}{C_{drn}} = V_{DD} + V_{th0} \cdot \frac{C_{src}}{C_{drn}} - V_{in} \cdot \frac{C_{src}}{C_{drn}} \quad (2)$$

Equation (2) is based on charge conservation, that is, an increase of charge on $C_{src}$ is equal to a decrease of charge on $C_{drn}$.

A gain, say $G_{100}$, of dynamic amplifier 100 is defined as an incremental change of $V_{out}$ divided by an incremental change of $V_{in}$ and is expressed as:

$$G_{100} \equiv \frac{dV_{out}}{dV_{in}} = -\frac{C_{src}}{C_{drn}} \quad (3)$$

The gain of dynamic amplifier 100 is thus determined by a ratio between the source capacitor $C_{src}$ and the drain capacitor $C_{drn}$.

An issue of dynamic amplifier 100 is that it is difficult for the output voltage $V_{out}$ to have a large swing, because an amount of a fall of $V_{out}$ always accompany a proportional amount of rise of $V_b$. Since $V_{out}$ cannot fall below $V_b$, an amount that $V_{out}$ can fall is hindered by an amount of rise of $V_b$.

What is desired is a dynamic amplifier that allows a large output swing.

SUMMARY OF THE DISCLOSURE

In an embodiment, a dynamic amplifier comprises: a common-source amplifier configured to receive a gate voltage at a gate node and output a drain current to a drain node in accordance with a source voltage at a source node; a current mirror configured to mirror the drain current into an output current to an output node; a source capacitor connected to the source node; a load capacitor connected to the output node; a first switch configured to conditionally connect the gate node to an input voltage in accordance with a first logical signal; a second switch configured to conditionally connect the gate node to a gate-resetting voltage in accordance with a second logical signal; a third switch configured to conditionally connect the source node to a source-resetting voltage in accordance with a third logical signal; a fourth switch configured to conditionally connect the drain node to a drain-resetting voltage in accordance with a fourth logical signal; and a fifth switch configured to conditionally connect the output node to an output-resetting voltage in accordance with a fifth logical signal, wherein in a reset phase the first logical signal is de-asserted, while the second logical signal, the third logical signal, the fourth logical signal, and the fifth logical signal are asserted, and in an amplification phase the first logical signal is asserted, while the second logical signal, the third logical signal, the fourth logical signal, and the fifth logical signal are de-asserted.

DETAILED DESCRIPTION OF THIS DISCLOSURE

Figure 1:
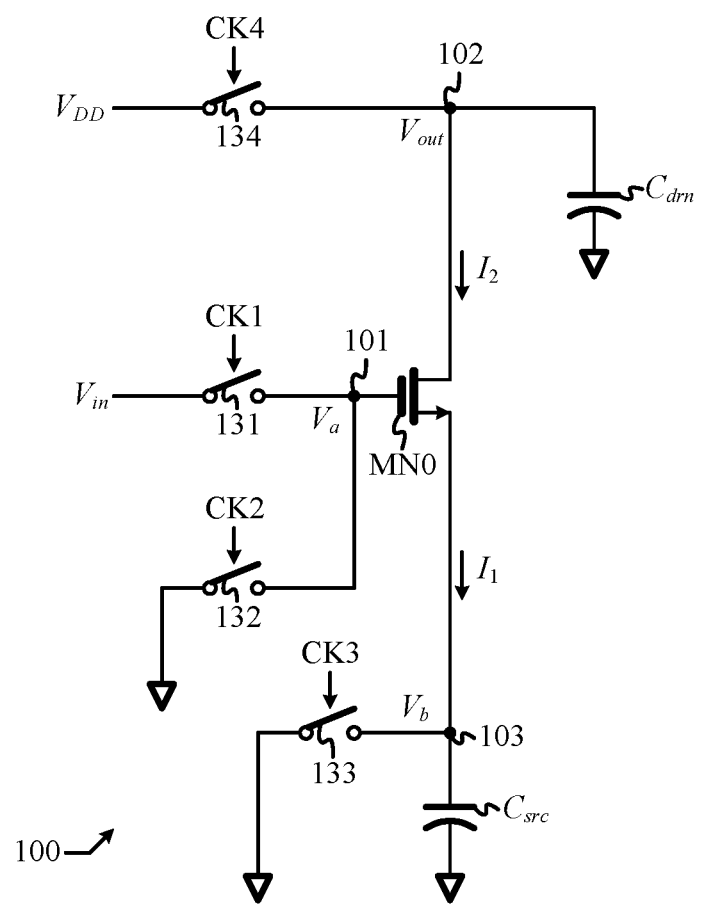
FIG. 1 shows a schematic diagram of a prior art dynamic amplifier.
Figure 2:
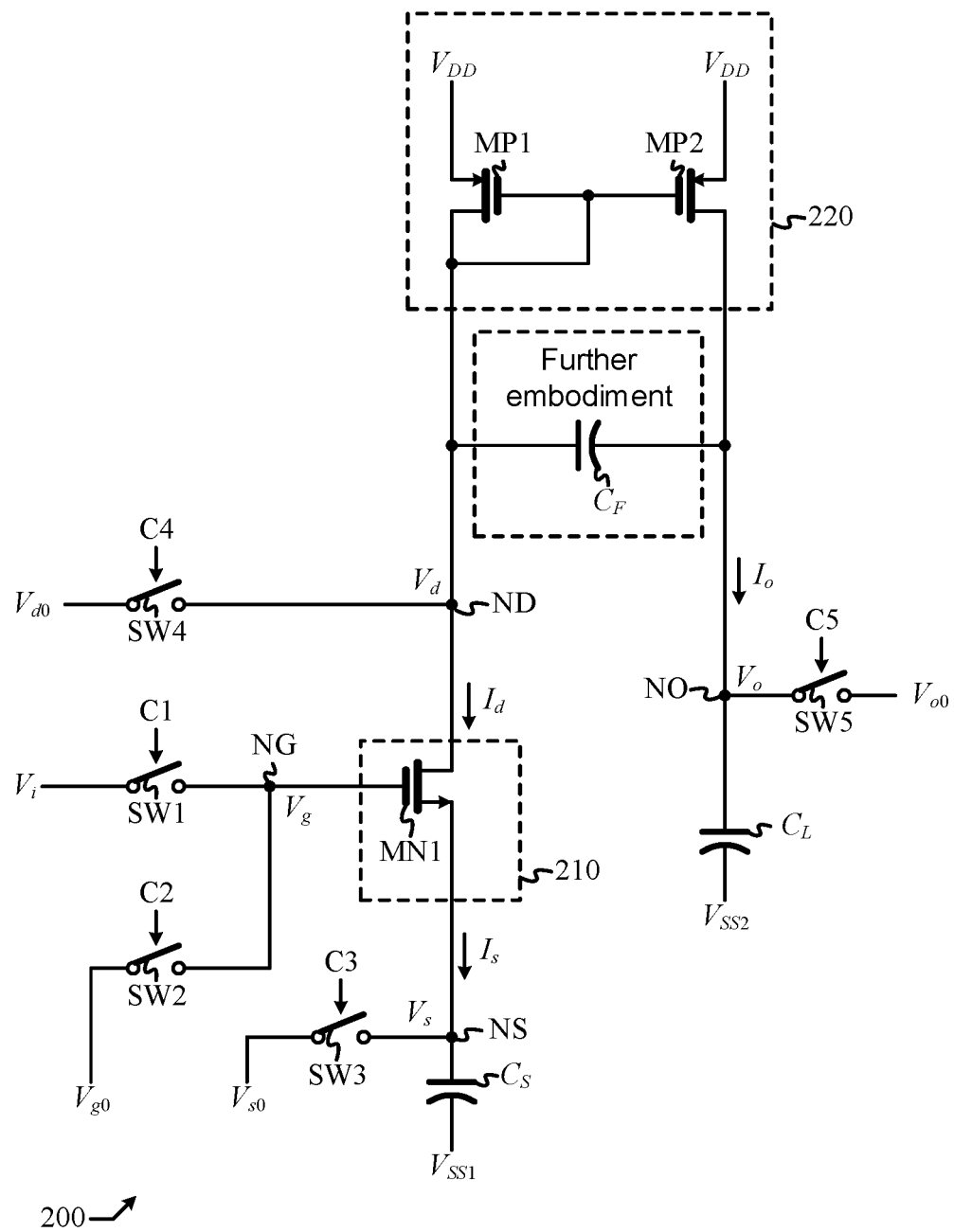
FIG. 2 shows a schematic diagram of a dynamic amplifier in accordance with an embodiment of the present disclosure.

The present disclosure is directed to dynamic amplifier. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "signal," "amplifier," "gain," "bias," "capacitor," "common-source amplifier," "current mirror," "load," "parallel connection," "circuit node," "ground," "DC (direct current)," "power supply," "MOS (metal oxide semiconductor) transistor," "CMOS (complementary metal oxide semiconductor) process technology," "NMOS (n-channel metal oxide semiconductor) transistor," and "PMOS (p-channel metal oxide semiconductor) transistor." Terms and basic concepts like these, when used in a context of microelectronics, are apparent to those of ordinary skill in the art and thus will not be explained in detail here.

Those of ordinary skills in the art understand units such as fF (femto-Farad), nm (nanometer), and μm (micron) without a need of explanations.

Those of ordinary skills in the art can read schematics of a circuit comprising electronic components such as inductors, capacitors, resistors, NMOS transistors, PMOS transistors, and so on, and do not need a verbose description about how one component connects with another in the schematics. Those of ordinary skill in the art can also recognize a ground symbol, a capacitor symbol, an inductor symbol, a resistor symbol, and symbols of PMOS transistor and NMOS transistor, and identify the "source terminal," the "gate terminal," and the "drain terminal" thereof. Pertaining to a MOS transistor, for brevity, hereafter, "source terminal" is simply referred to as "source," "gate terminal" is simply referred to "gate," and "drain terminal" is simply referred to "drain."

A circuit is a collection of a transistor, a capacitor, a resistor, and/or other electronic devices inter-connected in a certain manner to embody a certain function.

A power supply node is a circuit node of a substantially stationary voltage, and so is a ground node. Power supply node and ground node are both DC (direct current) nodes but differ in voltage level; that is, a voltage level of a power supply node is higher than a voltage level of a ground node. Following a convention widely used in the literature, in this disclosure, in a circuit, "$V_{DD}$" denotes a power supply node and "$V_{SS}$" denotes a ground node. If there are more than one power supply node in a circuit, "$V_{DD1}$" denotes a first power supply node and "$V_{DD2}$" denotes a second power supply node. If there are more than one ground node in a circuit, "$V_{SS1}$" denotes a first ground supply node and "$V_{SS2}$" denotes a second ground node.

A MOS transistor, PMOS or NMOS, has a threshold voltage. A NMOS transistor is turned on when its gate-to-source voltage is higher than its threshold voltage and turned off otherwise. In some literature, a PMOS transistor is turned on when its gate-to-source voltage is lower than its threshold voltage and turned off otherwise; this is based on a convention that a threshold voltage of a PMOS transistor is negative. In this present disclosure, we use a convention that a threshold voltage of a PMOS transistor is positive (i.e., we refer to the absolute value that is always positive), therefore we say, a PMOS transistor is turned on when its source-to-gate voltage is higher its threshold voltage and turned off otherwise.

In this disclosure, a "circuit node" is frequently simply stated as a "node" for short, when what it means is clear from a context.

A signal is a voltage of a variable level that carries a certain information and can vary with time. A level of the signal at a moment represents a state of the signal at that moment. In this present disclosure, "signal" and "voltage signal" refer to the same thing and thus are interchangeable.

A logical signal is a voltage signal of two states: a low state and a high state; the logical signal is in the high state when its voltage level is above a trip point and in the low state otherwise. The low state is also referred to as a "0" state, while the high stage is also referred to as a "1" state. Regarding a logical signal Q, the expression, "Q is high" or "Q is low," means that "Q is in the high state" or "Q is in the low state." Likewise, the expression "Q is 1" or "Q is 0," means that "Q is in the 1 state" or "Q is in the 0 state."

A first logical signal may not necessarily have the same trip point as a second logical signal.

A first logical signal is said to be a logical inversion of a second logical signal, if the first logical signal and the second logical signal are always in opposite states. That is, when the first logical signal is low, the second logical signal is high; when the first logical signal is high, the second logical signal is low. When a first logical signal is said to be a logical inversion of a second logical signal, the first logical signal and the second logical signal are said to be complementary to each other.

A logical signal is often used as a control signal to enable or disable a function of a circuit. When the logical signal is in a logical state that enables the function of the circuit, the logical signal is said to be "asserted"; otherwise, the logical signal is said to be "de-asserted." When a logical signal is "asserted" when it is high, it is said to be "active high"; when a logical signal is "asserted" when it is low, it is said to be "active low."

Switches are extensively used in the present disclosure. A switch is a device configured to conditionally connect a first node to a second node in accordance with a control by a logical signal; said switch is turned on and behaves like a short circuit when said logical signal is asserted; and said switch is turned off and behaves like an open circuit when said logical control signal is de-asserted.

A switch can be embodied by a NMOS transistor with a gate voltage controlled by an active high logical signal, while a first node and a second node connect to a source and a gate of the NMOS transistor, respectively; in this case, a trip point of the active high logical signal is equal to a source voltage at the first node plus a threshold voltage of the NMOS transistor.

Alternatively, a switch can be embodied by a PMOS transistor with a gate voltage controlled by an active low logical signal, while a first node and a second node connect to a source and a gate of the PMOS transistor, respectively; in this case, a trip point of the active low logical signal is equal to a source voltage at the first node minus a threshold voltage (which is a positive voltage per the convention used in the present disclosure) of the PMOS transistor.

Yet alternatively, a switch can be embodied by using a parallel connection of a NMOS transistor with a gate voltage controlled by an active high logical signal and a PMOS transistor with a gate voltage controlled by an active low logical signal, wherein the active high logical signal and active low logical signal are complementary. This is known as "transmission gate" and well understood by those of ordinary skill in the art and thus not described in detail here.

As shown in FIG. 1, a dynamic amplifier 200 in accordance with an embodiment of the present disclosure comprise: a common-source amplifier 210 comprising a NMOS transistor MN1 configured to receive a gate voltage $V_g$ at a gate node NG and output a drain current $I_d$ to a drain node ND in accordance with a source voltage $V_s$ at a source node NS; a source capacitor $C_S$ connected to the source node NS and configured to hold the source voltage $V_s$; a current mirror 220 comprising a first PMOS transistor MP1 and a second PMOS transistor MP2 configured to mirror the drain current $I_d$ into an output current $I_o$ to an output node NO; a load capacitor $C_L$ connected to the output node NO and configured to hold an output voltage $V_o$; a first switch SW1 configured to conditionally connect the gate node NG to an input voltage $V_i$ in accordance with a first logical signal C1; a second switch SW2 configured to conditionally connect the gate node NG to a gate-resetting voltage $V_{g0}$ in accordance with a second logical signal C2; a third switch SW3 configured to conditionally connect the source node NS to a source-resetting voltage $V_{s0}$ in accordance with a third logical signal C3; a fourth switch SW4 configured to conditionally connect the drain node ND to a drain-resetting voltage $V_{d0}$ in accordance with a fourth logical signal C4; and a fifth switch SW5 configured to conditionally connect the output node NO to an output resetting voltage $V_{o0}$ in accordance with a fifth logical signal C5. Dynamic amplifier 200 works in a two-phase manner including a reset phase and an amplification phase. During the reset phase, C2, C3, C4, and C5 are asserted (and consequently SW2, SW3, SW4, and SW5 are turned on and behave like a short circuit), while C1 is de-asserted (and consequently SW1 is turned off and behaves like an open circuit); as a result, NMOS transistor MN1 is shut off, the gate voltage $V_g$ is equal to $V_{g0}$ and the source voltage $V_s$ is equal to $V_{s0}$, the drain voltage $V_d$ is equal to $V_{d0}$, and the output voltage $V_o$ is equal to $V_{o0}$.

During the amplification phase, C2, C3, C4, and C5 are de-asserted (and consequently SW2, SW3, SW4, and SW5 are turned off and behave like an open circuit), while C1 is asserted (and consequently SW1 is turned on and behaves like a short circuit); the gate voltage $V_g$ is tied to the input voltage $V_i$; a source current $I_s$ of NMOS transistor MN1 charges the source capacitor $C_S$ and pulls up the source voltage $V_s$; the drain current $I_d$ is mirrored to the output current $I_o$ to charge the load capacitor $C_L$ and pulls up the output voltage $V_o$. A higher input voltage $V_i$ will cause NMOS transistor MN1 to have a larger gate-to-source voltage and lead to a larger drain current $I_d$ and consequently a larger output current $I_o$ and a higher output voltage $V_o$.

In an embodiment, $V_{g0}$, $V_{s0}$, $V_{d0}$, and $V_{o0}$ are chosen to meet the following constraints:

$$V_{d0} \leq V_{DD} \quad (4)$$

$$V_{g0} \leq V_{d0} + V_{th1} \quad (5)$$

$$V_{g0} \leq V_{s0} + V_{th1} \quad (6)$$

$$V_{o0} \leq V_{DD} \quad (7)$$

Here, $V_{th1}$ is a threshold voltage of NMOS transistor MN1.

The constraints of Equations (4), (5), and (6) ensure that NMOS transistor MN1 is shut off during the reset phase, while the constraints of Equation (7) ensures that the current mirror can fulfill the current-mirroring function during the amplification phase.

At the end of the amplification phase, the gate-to-source voltage of NMOS transistor NM1 reaches its threshold voltage $V_{th1}$, and can be expressed as:

$$V_s = V_i - V_{th1} \quad (8)$$

$$V_o = V_{o0} + (V_s - V_{s0}) \cdot \frac{C_s}{C_L} \cdot \beta = V_{o0} - (V_{th1} + V_{s0}) \cdot \frac{C_s}{C_L} \cdot \beta + V_i \cdot \frac{C_s}{C_L} \cdot \beta \quad (9)$$

Here, $\beta$ is a current-mirroring factor of the current mirror 220 and can be expressed by:

$$\beta = \frac{W_2}{L_2} \cdot \frac{L_1}{W_1} \quad (10)$$

Here, $W_1$ and $L_1$ are a width and a length of PMOS transistor MP1, and $W_2$ and $L_2$ are a width and a length of PMOS transistor MP2.

Equation (9) is based on charge conservation along with current mirroring, that is, an increase of charge on $C_L$ is equal to an increase of charge on $C_S$ times the current mirroring factor $\beta$ of the current mirror 220.

A gain, say $G_{200}$, of dynamic amplifier 200 is defined as an incremental change of $V_o$ divided by an incremental change of $v_i$ and is expressed as:

$$G_{200} \equiv \frac{dV_o}{dV_i} = \beta \cdot \frac{C_s}{C_L} \quad (11)$$

Dynamic amplifier 200 has a few advantages. First, it can have a large output swing thanks to using the current mirror 220, which effectively prevents the output voltage $V_o$ from being limited by the source voltage $V_s$. The output swing is limited only be the PMOS transistor MP2, which can charge the output voltage $V_o$ to nearly $V_{DD}$ and thus allow $V_o$ to have a large swing. Second, a gain of dynamic amplifier is determined by a ratio between the source capacitor $C_S$ and the load capacitor $C_L$ times the current-mirroring factor $\beta$. So, a higher gain can be achieved, and a circuit designer can have a higher degree of freedom in optimizing a design.

By way of example but not limitation, in an embodiment: dynamic amplifier 200 is fabricated on a silicon substrate using a 12 nm CMOS process technology; $V_{DD}$ is 0.8V; $V_{SS1}$ is 0V; $V_{SS2}$ is 0V; $V_{g0}$ is 0V; $V_{s0}$ is 0V; $V_{d0}$ is 0.8V; $C_1$ is 200 fF; $C_2$ is 200 fF; W/L (which stands for width/length) of NMOS transistor MN1 is 2 μm/16 nm; W/L of PMOS transistor MP1 is 2 μm/16 nm; and W/L of PMOS transistor MP2 is 6 μm/16 nm.

In a further embodiment, dynamic amplifier 200 further comprises a feedback capacitor $C_F$ inserted between the drain node ND and the output node NO. A purpose of the feedback capacitor $C_F$ is to reduce a nonlinearity of the dynamic amplifier 200 by means of negative feedback, as a nonlinear error of $V_o$ can be fed back to the drain node ND to cause the PMOS transistor MP2 to adjust the output current $I_o$ to correct the nonlinear error. By way of example but not limitation, in an embodiment, $C_F$ is 25 fF.

It is known in the prior art that, for a given first circuit, if every NMOS transistor is replaced with a PMOS transition, every PMOS transistor is replaced with a NMOS transistor, every power supply node is replaced with a ground node, and every ground node is replaced with a power supply node, then the resultant second circuit will be functionally equivalent to the originally given first circuit. Having said that, in an alternative embodiment not shown in figure but clear to those of ordinary skill in the art, dynamic amplifier 200 can be modified by applying the following changes:

NMOS transistor MN1 is replaced with a PMOS transistor MP1' (with a threshold voltage $V_{th1}'$ in absolute value); PMOS transistor MP1 is replaced with a first NMOS transistor MN1'; PMOS transistor MP2 is replaced with a second NMOS transistor MN2'; power supply node "$V_{DD}$" is changed to a ground node "$V_{SS}$"; the first ground node "$V_{SS1}$" is changed to a first power supply node "$V_{DD1}$"; the second ground node is changed to a second power supply node "$V_{DD2}$"; and $V_{g0}$, $V_{s0}$, $V_{d0}$, and $V_{o0}$ are chosen to meet the following constraints:

$$V_{d0} \geq V_{SS} \tag{12}$$

$$V_{g0} \geq V_{d0} - V_{th1}' \tag{13}$$

$$V_{g0} \geq V_{s0} - V_{th1}' \tag{14}$$

$$V_{o0} \geq V_{SS} \tag{15}$$

Equations (12), (13), and (14) ensures that PMOS transistor MP1' is shut off during the reset phase, while Equation (15) ensures that the current mirror embodied by the first NMOS transistor MN1' and the second NMOS transistor MN2' can fulfill the current-mirroring function during the amplification phase.

This alternative embodiment is a "flipped" version of dynamic amplifier 200 and is functionally equivalent. In the appended claims, one of NMOS transistor and PMOS transistor is referred to as MOS transistor of a first type, while the other is referred to as MOS transistor of a second type. In dynamic amplifier 200, MOS transistor of the first type and MOS transistor of the second type refer to NMOS transistor and PMOS transistor, respectively. In the alternative embodiment, MOS transistor of the first type and MOS transistor of the second type refer to PMOS transistor and NMOS transistor, respectively.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A dynamic amplifier working in a two-phase manner including a reset phase and an amplification phase and comprising:
    a common-source amplifier configured to receive a gate voltage at a gate node and output a drain current to a drain node in accordance with a source voltage at a source node;
    a current mirror configured to mirror the drain current into an output current to an output node;
    a source capacitor connected to the source node;
    a load capacitor connected to the output node;
    a first switch configured to conditionally connect the gate node to an input voltage in accordance with a first logical signal;
    a second switch configured to conditionally connect the gate node to a gate-resetting voltage in accordance with a second logical signal;
    a third switch configured to conditionally connect the source node to a source-resetting voltage in accordance with a third logical signal;
    a fourth switch configured to conditionally connect the drain node to a drain-resetting voltage in accordance with a fourth logical signal;
    and a fifth switch configured to conditionally connect the output node to an output-resetting voltage in accordance with a fifth logical signal, wherein during the reset phase the first logical signal is de-asserted, while the second logical signal, the third logical signal, the fourth logical signal, and the fifth logical signal are asserted, and during the amplification phase the first logical signal is asserted, while the second logical signal, the third logical signal, the fourth logical signal, and the fifth logical signal are de-asserted.

2. The dynamic amplifier of claim 1, wherein the common-source amplifier comprises a MOS (metal-oxide semiconductor) transistor of a first type with a gate connected to the gate node, a source connected to the source node, and a drain connected to the drain node.

3. The dynamic amplifier of claim 2, wherein the current mirror comprises: a first MOS transistor of a second type with a drain and a gate connected to the drain node and a source connected to a DC (direct current) node; and a second MOS transistor of the second type with a gate connected to the drain node, a drain connected to the output node, and a source connected to the DC node.

4. The dynamic amplifier of claim 3, wherein the MOS transistor of the first type is a NMOS (n-channel metal oxide semiconductor) transistor, the first MOS transistor of the second type is a first PMOS (p-channel metal oxide semiconductor) transistor, and the second MOS transistor of the second type is a second PMOS transistor.

5. The dynamic amplifier of claim 4, wherein the DC node is a power supply node, the drain-resetting voltage is not higher than a voltage of the power supply node, and the output-resetting voltage is not higher than the voltage of the power supply node.

6. The dynamic amplifier of claim 5, wherein the gate-resetting voltage is not higher than the drain-resetting voltage by more than a threshold voltage of the NMOS transistor, and not higher than the source-resetting voltage by more than the threshold voltage of the NMOS transistor.

7. The dynamic amplifier of claim 3, wherein the MOS transistor of the first type is a PMOS (p-channel metal oxide semiconductor) transistor, the first MOS transistor of the second type is a first NMOS (n-channel metal oxide semiconductor) transistor, and the second MOS transistor of the second type is a second NMOS transistor.

8. The dynamic amplifier of claim 7, wherein the DC node is a ground node, the drain-resetting voltage is not lower than a voltage of the ground node, and the output-resetting voltage is not lower than the voltage of the ground node.

9. The dynamic amplifier of claim 8, wherein the gate-resetting voltage is not lower than the drain-resetting voltage by more than a threshold voltage of the PMOS transistor, and not lower than the source-resetting voltage by more than the threshold voltage of the PMOS transistor.

10. The dynamic amplifier of claim 1 further comprises a feedback capacitor inserted between the drain node and the output node.

* * * * *